United States Patent
Mori (10) Patent No.: US 7,936,442 B2
(45) Date of Patent: May 3, 2011

(54) EXPOSURE APPARATUS, EXPOSURE METHOD, AND DEVICE FABRICATION METHOD

(75) Inventor: Kenichiro Mori, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 677 days.

(21) Appl. No.: 11/943,885

(22) Filed: Nov. 21, 2007

(65) Prior Publication Data

US 2008/0123068 A1    May 29, 2008

(30) Foreign Application Priority Data

Nov. 29, 2006    (JP) ................................ 2006-322526

(51) Int. Cl.
*G03B 27/52* (2006.01)
*G03B 27/68* (2006.01)
*G03B 27/42* (2006.01)
*G03B 27/54* (2006.01)

(52) U.S. Cl. ................. 355/30; 355/52; 355/53; 355/67

(58) Field of Classification Search ............. 355/30, 355/52, 53, 55, 67–71, 77; 250/492.1, 492.2, 250/492.22, 548; 356/337, 338, 432, 237.3, 356/237.6

See application file for complete search history.

(56) References Cited

U.S. PATENT DOCUMENTS

| | | | | |
|---|---|---|---|---|
| 5,055,679 A * | 10/1991 | Ninomiya et al. | ............... | 850/56 |
| 5,172,421 A * | 12/1992 | Nakamura et al. | ............ | 382/141 |
| 5,389,555 A * | 2/1995 | Watanabe et al. | ............. | 436/164 |
| 6,064,477 A * | 5/2000 | Matsumoto et al. | ....... | 356/237.2 |
| 6,496,257 B1 * | 12/2002 | Taniguchi et al. | ......... | 356/239.2 |
| 6,891,603 B2 * | 5/2005 | Nishi | ............................. | 355/77 |
| 2004/0218164 A1 * | 11/2004 | Kohno | ........................... | 355/67 |
| 2006/0011870 A1 * | 1/2006 | Yamamoto et al. | ....... | 250/504 R |

FOREIGN PATENT DOCUMENTS

JP    02-025016      1/1990
JP    11-288870 A   10/1999

OTHER PUBLICATIONS

English translation of JP11-288870, published Oct. 19, 2009.*

* cited by examiner

*Primary Examiner* — Peter B Kim
*Assistant Examiner* — Christina Riddle
(74) *Attorney, Agent, or Firm* — Rossi, Kimms & McDowell LLP

(57) ABSTRACT

An exposure apparatus comprises an illumination optical system configured to illuminate a reticle with a light beam from a light source, a projection optical system configured to project a pattern of the reticle onto a substrate, a measurement unit configured to measure a light quantity distribution in an exposure area on an image plane of the projection optical system, and a detection unit configured to detect an existence of a foreign particle in the illumination optical system and the projection optical system based on the light quantity distribution measured by the measurement unit.

6 Claims, 13 Drawing Sheets

SCANNING DIRECTION

EXPOSURE APPARATUS, EXPOSURE METHOD, AND DEVICE FABRICATION METHOD

BACKGROUND OF THE INVENTION

Field of the Invention

The present invention relates to an exposure apparatus, an exposure method, and a device fabrication method.

A projection exposure apparatus has conventionally been employed to fabricate very fine semiconductor devices using photolithography. The projection exposure apparatus projects and transfers the circuit pattern formed on a reticle (mask) onto, e.g., a wafer via a projection optical system.

The projection exposure apparatus is required to maintain a uniform light quantity (exposure light quantity) in an exposure area. A strictly uniform light quantity becomes necessary especially in fabricating image sensing devices such as a CCD sensor and CMOS sensor and display devices such as an LCD. Here, the exposure area means an exposure light irradiation area on a substrate such as a wafer. When the light quantity in the exposure area changes, the width of a circuit line transferred onto the photosensitive agent also changes, resulting in a variation in electrical circuit characteristics. In this case, a sensitivity variation occurs in fabricating an image sensing device, while an uneven color development occurs in fabricating a display device. If the sensitivity variation or uneven color development is serious, the fabricated image sensing device or display device must be eliminated as a defective product.

Figure 11:
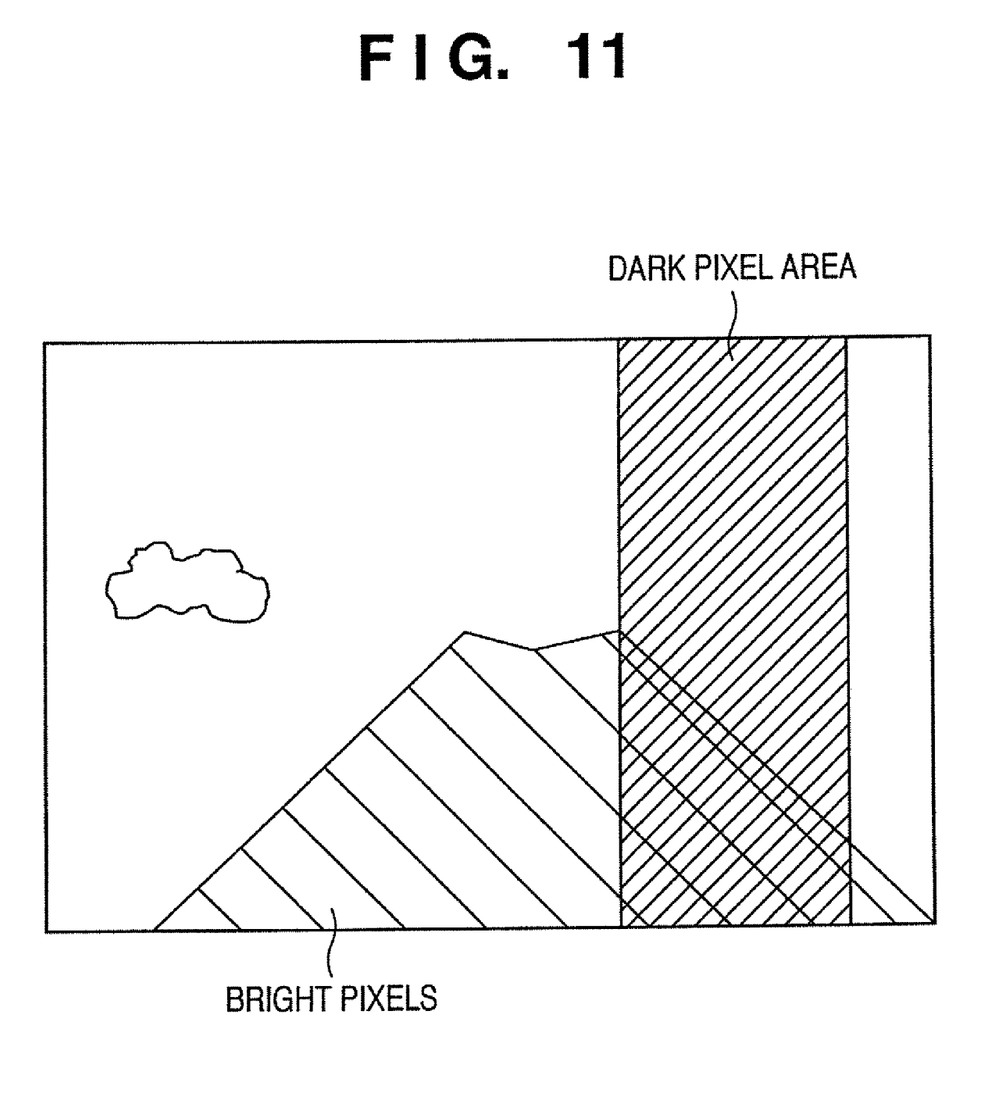
FIG. 11 is a view of one example of an image displayed on a display device suffering an uneven color development.

Viewers can watch an image displayed on a display device without feeling any discomfort if the brightness (color development) changes continuously in the image, but feel uncomfortable if it changes discontinuously. For example, when people watch an image as shown in FIG. 11, they are sensitive to a dark pixel area (owing to a change in circuit line width within the area) on the right side. For this reason, in fabricating image sensing devices such as a CCD sensor and CMOS sensor and display devices such as an LCD, a continuous change in light quantity in an exposure area is less problematic but a local change in light quantity (the light quantity uniformity in the exposure area) is problematic. Here, FIG. 11 is a view of one example of an image displayed on a display device suffering an uneven color development.

A local change in light quantity in the exposure area often occurs (the light quantity uniformity suffers) due to light shielding or light attenuation by a foreign particle (a light-shielding object) in an illumination optical system or a projection optical system. Examples of the foreign particle are dust (dirt) adhering on a lens, bubbles entrapped in a glass material, a film material deteriorated upon forming a film on a lens, a deteriorated (exposed) material of a lens, and a flaw of a lens, including light-attenuating objects.

Figure 12:
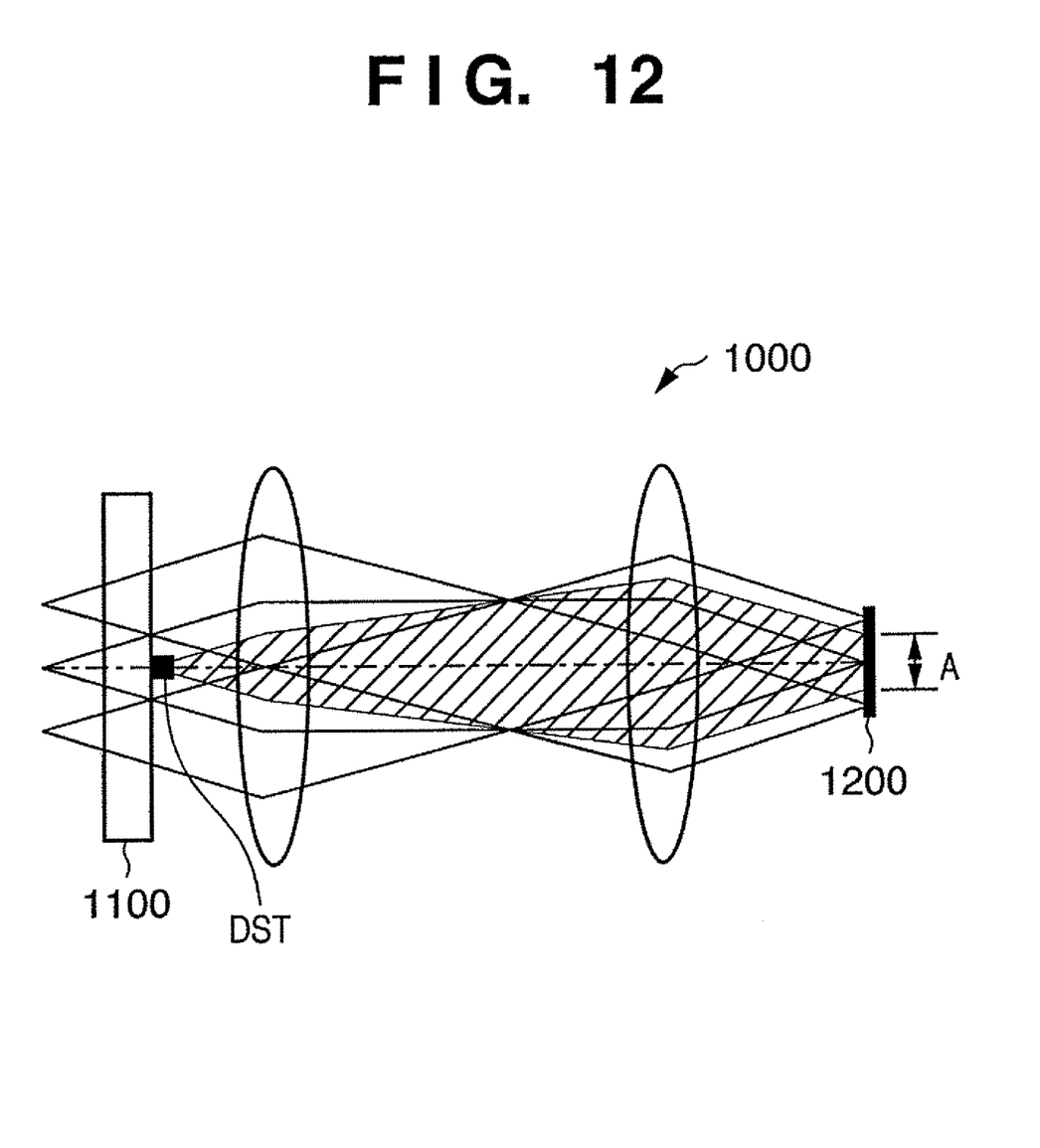
FIG. 12 is a view for explaining how a foreign particle in a projection optical system locally changes the exposure light quantity.

FIG. 12 is a view for explaining how a foreign particle in a projection optical system locally changes the light quantity. FIG. 12 exemplifies a case wherein dust DST has adhered on the exit surface of a plane-parallel plate 1100 of a projection optical system 1000. The dust DST adhering on the exit surface of the plane-parallel plate 1100 shields or attenuates exposure light. Consequently, a shadow as indicated by a hatched portion in FIG. 12 appears and hence the light quantity in an area A on a substrate 1200 decreases, resulting in a local change in light quantity. The same applies to a case wherein a foreign particle other than dust exists and a case wherein a foreign particle exists in an illumination optical system.

Figure 13:
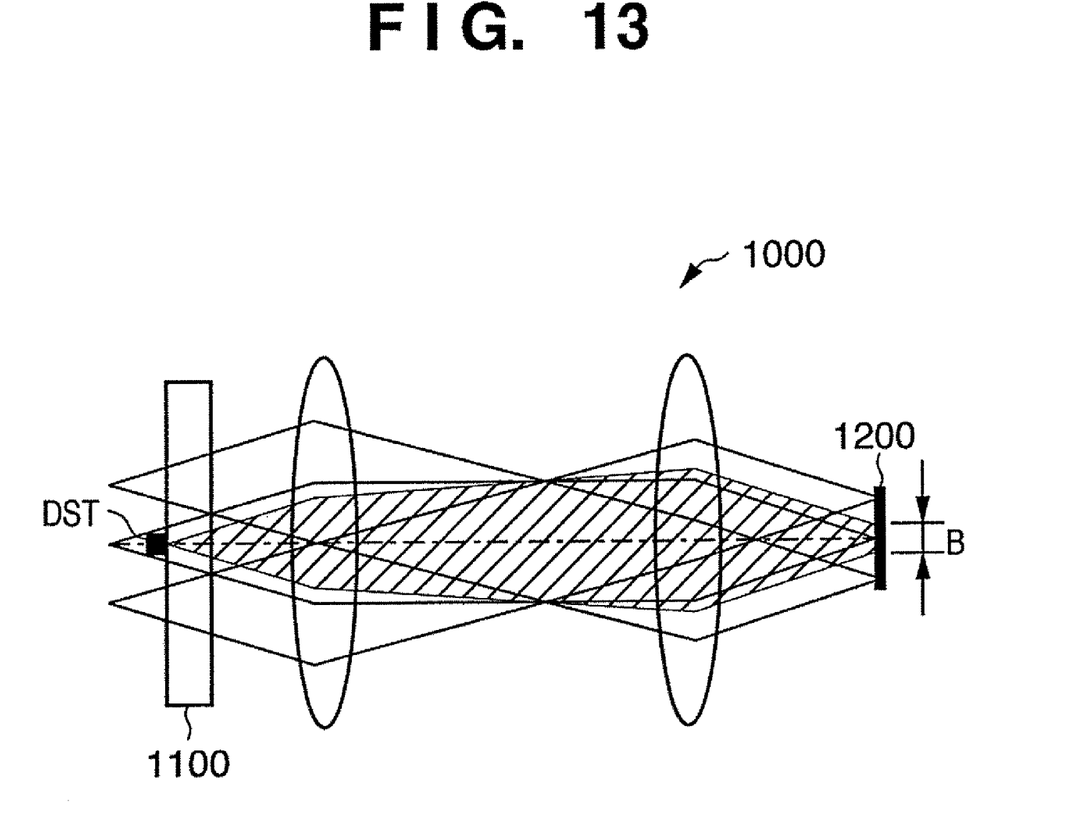
FIG. 13 is a view for explaining how the size of a shadow projected onto a substrate changes depending on the position of the foreign particle in the projection optical system.

Since the projection exposure apparatus can use only light having a predetermined angle of divergence, the shadow (shielded light beam) indicated by the hatched portion in FIG. 12 extends in a predetermined pattern. This makes it possible to specify the position of the foreign particle by measuring the size of the shadow projected onto the substrate. For example, as shown in FIG. 13, if the dust DST is adhering on the incident surface of the plane-parallel plate 1100, a shadow is formed in an area B different from the area A shown in FIG. 12 on the substrate 1200. FIG. 13 is a view for explaining how the size of the shadow projected onto the substrate 1200 changes depending on the position of the foreign particle in the projection optical system 1000.

Whether such a local change in light quantity (light quantity nonuniformity) has occurred can be confirmed by so-called open frame inspection. This inspection is used to confirm whether a local change in light quantity has occurred in the following way. That is, a substrate coated with a photosensitive agent without a reticle is exposed with a light quantity that is sufficiently smaller than the sensitivity of the photosensitive agent (called "open frame exposure"). After development, the remaining film state of the photosensitive agent is visually checked. If a local change in light quantity has occurred, the remaining film thickness of the photosensitive agent is nonuniform. A wavelength at which interfering light components strengthen each other on the remaining film of the photosensitive agent changes depending on the remaining film thickness. For this reason, when a substrate having undergone open frame exposure by an exposure apparatus which causes a local change in light quantity is observed with incandescent light, it exhibits color gradation as in the rainbow. By visually checking such color gradation and comparing it with a predetermined limit specimen (reference), it is determined whether a local change in light quantity is allowable.

If it is determined by open frame inspection that the local change in light quantity is not allowable, the size of a shadow projected onto the substrate is measured to specify the position of a foreign particle. An appropriate measure is then taken to improve the light quantity uniformity. Detailed examples of the measure are cleaning if the foreign particle is dust, and lens replacement if the foreign particle is bubble entrapped in a glass material, a deteriorated film material, and a deteriorated material and flaw of a lens.

Japanese Patent Laid-Open No. 2-25016 proposes a method of inspecting an illumination optical system for a foreign particle.

Unfortunately, the open frame inspection requires coating, exposure, development, and visual checking processes for a photosensitive agent, so it takes much time to inspect. Still worse, the open frame inspection evaluates the film remaining after developing the photosensitive agent under the influence of error factors such as an uneven coating and uneven development of the photosensitive agent. This makes it impossible to accurately confirm whether the foreign particle has locally changed the light quantity. Furthermore, the open frame inspection cannot perform quantitative evaluation (inspection) because whether a local change in light quantity has occurred is confirmed by visual check which inevitably depends on the technical skill of the inspector.

SUMMARY OF THE INVENTION

The present invention provides an exposure apparatus which can simply detect a foreign particle (a light-shielding object) in an optical system.

According to one aspect of the present invention, there is provided an exposure apparatus comprising an illumination optical system configured to illuminate a reticle with a light beam from a light source, a projection optical system configured to project a pattern of the reticle onto a substrate, a measurement unit configured to measure a light quantity distribution in an exposure area on an image plane of the projection optical system, and a detection unit configured to detect an existence of a foreign particle in the illumination optical system and the projection optical system based on the light quantity distribution measured by the measurement unit.

According to another aspect of the present invention, there is provided an exposure method for transferring a pattern of a reticle onto a substrate by exposure, the method comprising the steps of measuring a light quantity distribution in an exposure area on an image plane of a projection optical system configured to project the pattern of the reticle onto the substrate, determining an existence of a foreign particle in an illumination optical system configured to illuminate the reticle and the projection optical system based on the light quantity distribution measured in the step of measuring, and determining exposure by determining whether to continue exposure if it is determined in the step of determining that the foreign particle exists.

According to still another aspect of the present invention, there is provided a device fabrication method comprising the steps of exposing a substrate using the above exposure apparatus, and performing a development process for the exposed substrate.

Further features of the present invention will become apparent from the following description of exemplary embodiments with reference to the attached drawings.

DESCRIPTION OF THE EMBODIMENTS

Figure 1:
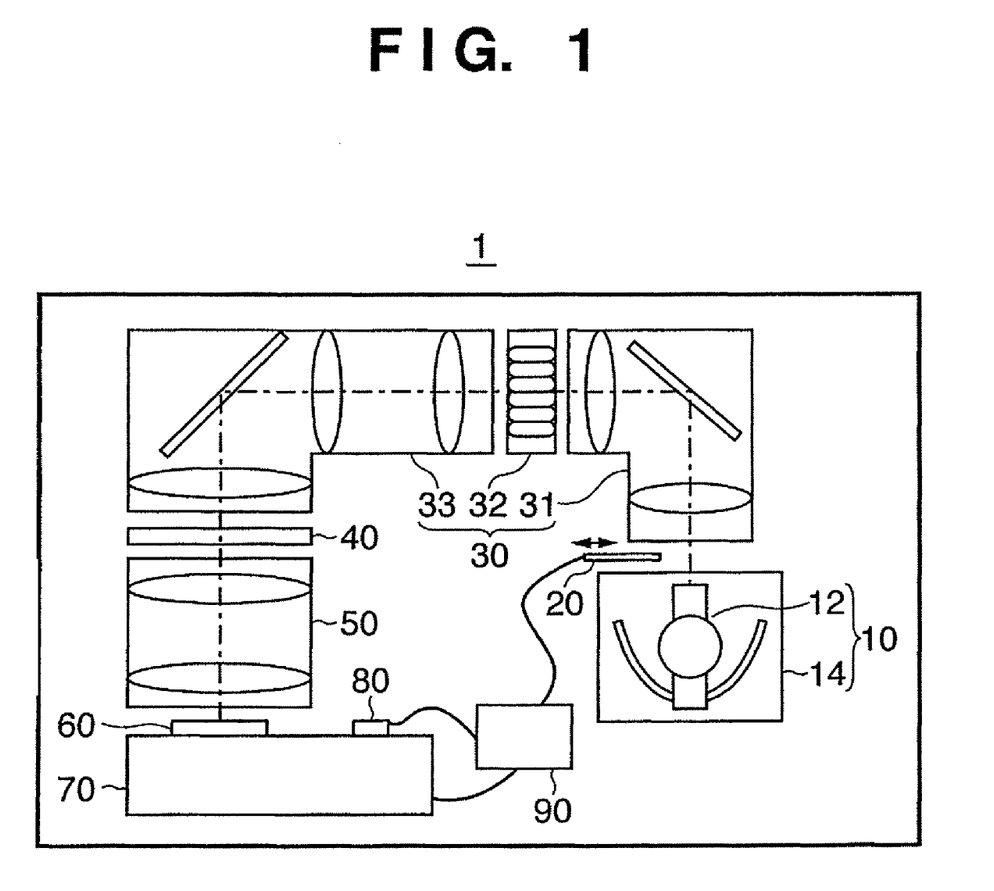
FIG. 1 is a schematic sectional view of an exposure apparatus according to one aspect of the present invention.

With reference to the accompanying drawings, a description will now be given of an exposure apparatus of one embodiment according to the present invention. The same reference numeral in each figure denotes the same element, and a duplicate description thereof will be omitted. Here, FIG. 1 is a schematic sectional view of an exposure apparatus according to the present invention.

An exposure apparatus 1 is a projection exposure apparatus which transfers the pattern of a reticle 40 onto a wafer (substrate) 60 by exposure in a step-and-scan manner. The exposure apparatus 1 includes an illumination apparatus, a reticle stage which mounts the reticle 40, a projection optical system 50, a wafer stage 70 which mounts the wafer 60, a measurement unit 80, and a control unit 90.

The illumination apparatus includes a light source unit 10, shutter 20, and illumination optical system 30, and illuminates the reticle 40 on which a circuit pattern to be transferred is formed.

The light source unit 10 includes a light source 12 and lamp box 14. In this embodiment, the light source 12 uses a super-high pressure mercury lamp (g-line (wavelength: about 436 nm) or i-line (wavelength: about 365 nm)). However, the light source 12 is not limited to a lamp and may use a laser. The lamp box 14 includes a condensing mirror for converging a light beam emitted by the light source 12.

The shutter 20 is inserted between the light source unit 10 and the illumination optical system 30. The shutter 20 opens/closes under the control of the control unit 90 (to be described later) to switch between the supply and the stop of the light beam emitted by the light source unit 10. In other words, the shutter 20 controls the light quantity (exposure light quantity) in the exposure area in cooperation with the control unit 90.

The illumination optical system 30 illuminates the reticle 40 with the light beam from the light source unit 10. In this embodiment, the illumination optical system 30 includes a light-leading optical system 31, fly-eye lens 32, and condenser optical system 33.

The light-leading optical system 31 increases or decreases the light beam from the light source unit 10 to guide a light beam having a predetermined distribution to the fly-eye lens 32.

The fly-eye lens 32 splits the wavefront of the light beam so that a light beam having a uniform angular distribution emerges from it.

The condenser optical system 33 illuminates the reticle 40 with a light beam which emerges from the exit surface of the fly-eye lens 32 as a secondary light source and has a uniform illuminance distribution.

The reticle 40 has a circuit pattern and is held and driven by the reticle stage. The reticle 40 can be exchanged and inserted in and retracted from the optical path via the reticle stage. Light diffracted by the reticle 40 is projected onto the wafer 60 via the projection optical system 50.

The projection optical system 50 projects the pattern image of the reticle 40 onto the wafer 60. The projection optical system 50 can use a dioptric system, catadioptric system, or catoptric system.

The wafer 60 is held and driven by the wafer stage 70. Although a wafer is used as the substrate in this embodiment, it is also possible to use another substrate such as a glass plate. The wafer 60 is coated with a photoresist.

The wafer stage 70 holds and drives the wafer 60 and the measurement unit 80 (to be described later). The wafer stage 70 can take any form known to those skilled in the art, and preferably has six coaxial axes.

The measurement unit 80 is arranged on the wafer stage 70. The measurement unit 80 is conveyed to the exposure area by the wafer stage 70, and measures the light quantity distribution in the exposure area on the image plane of the projection optical system 50. For example, the measurement unit 80 may measure the light quantity distribution by detecting the light quantity at a plurality of measurement positions in the exposure area. In other words, the measurement unit 80 may measure the light quantity distribution by detecting the light quantity in an area smaller than the exposure area (i.e., a part of the exposure area). In this case, the measurement unit 80 detects the light quantity while moving within the exposure area step by step via the wafer stage 70 to measure the light quantity distribution in the exposure area.

Figure 2:
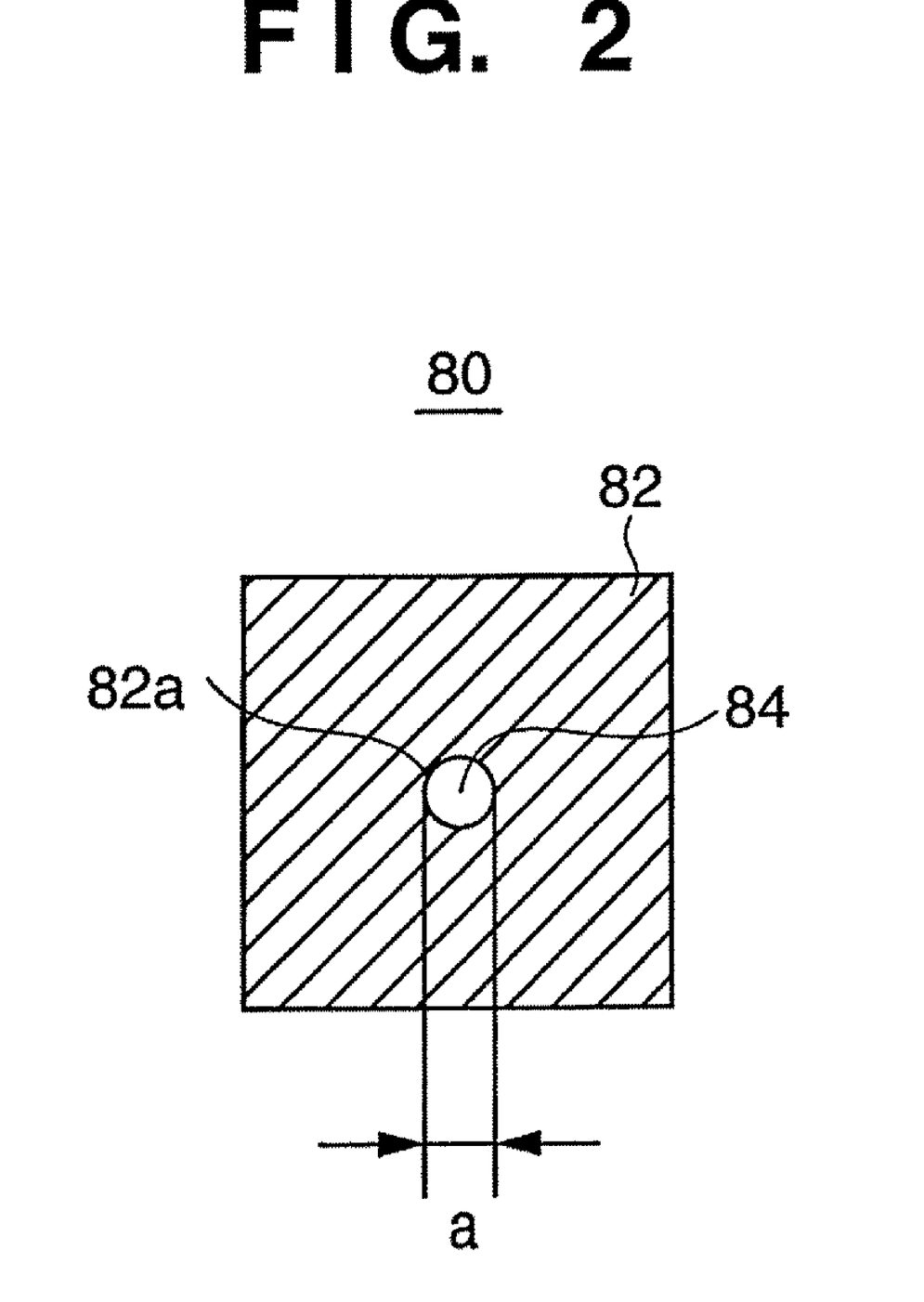
FIG. 2 is a schematic plan view of a pinhole sensor as one example of a measurement unit of the exposure apparatus shown in FIG. 1.

The measurement unit 80 uses a pinhole sensor in this embodiment. As shown in FIG. 2, the pinhole sensor as the measurement unit 80 includes a mask 82 and light receiving unit 84. The mask 82 has a pinhole (opening) 82a having a diameter a (mm). The light receiving unit 84 receives the light beam having passed through the pinhole 82a. The pinhole sensor as the measurement unit 80 can measure the light quantity in the area having the diameter a. The diameter a of the pinhole 82a is preferably equal to or smaller than 1/50 the exposure area. For example, in an exposure apparatus having an exposure area of 26 (mm)×33 (mm), the diameter a (mm) of the pinhole 82a is preferably equal to or smaller than 0.5 (mm). Here, FIG. 2 is a schematic plan view of the pinhole sensor as one example of the measurement unit 80.

Figure 3:
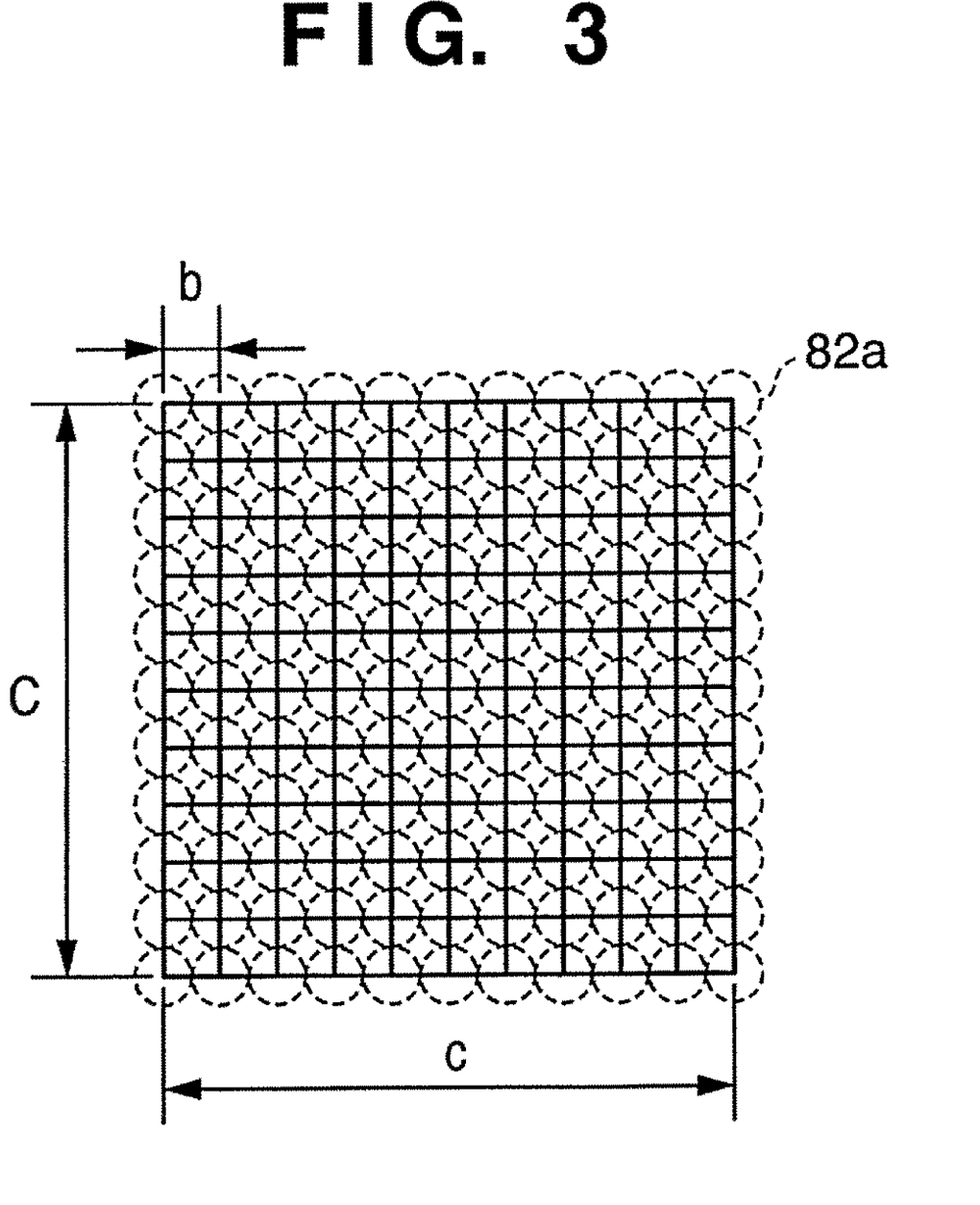
FIG. 3 is a view for explaining the measurement of the light quantity (light quantity distribution) in an exposure area by the pinhole sensor as the measurement unit of the exposure apparatus shown in FIG. 1.

FIG. 3 is a view for explaining the measurement of the light quantity (light quantity distribution) in the exposure area by the pinhole sensor as the measurement unit 80. Referring to FIG. 3, the dotted circles indicate the positions (measurement positions) of the pinholes 82a, i.e., the pinhole sensor in light quantity measurement. The pinhole sensor as the measurement unit 80 detects the light quantity at each measurement position (measurement point) while moving within an exposure area (or a part of the exposure area) of c (mm)×c (mm) step by step along a two-dimensional grid pattern at a pitch b (mm). With this operation, the pinhole sensor as the measurement unit 80 can finely measure the light quantity distribution in the exposure area. The pitch b (mm) is preferably equal to or narrower than 1/50 the exposure area. For example, in an exposure apparatus having an exposure area of 26 (mm)×33 (mm), the pitch b (mm) is preferably equal to or narrower than 0.5 (mm). It is also preferable to make it possible to detect only the light quantity (light quantity distribution) in a part of the exposure area for the following reason. That is, the detection of the light quantity (light quantity distribution) over the entire exposure area requires a large number of measurement points and hence takes too long a measurement time. An arbitrary area can be desirably designated as the part of the exposure area.

The control unit 90 includes a CPU and memory and controls the operation of the exposure apparatus 1. For example, the control unit 90 controls the light quantity (exposure light quantity) in the exposure area via the shutter 20. In addition, according to this embodiment, the control unit 90 analyzes the output (measurement result) from the measurement unit 80 to detect and evaluate a local (discontinuous) change in light quantity in the exposure area. In other words, the control unit 90 functions as an abnormality detection unit which detects, based on the light quantity distribution measured by the measurement unit 80, a foreign particle (light-attenuating object) that exists in the optical system (at least one of the illumination optical system 30 and the projection optical system 50) and causes a local change in light quantity.

The control unit 90 separates a continuous change in light quantity from a local (discontinuous) change in light quantity based on the light quantity distribution measured by the measurement unit 80 to detect and evaluate the local change in light quantity in the exposure area. More specifically, the control unit 90 extracts a local change in light quantity by calculating the second derivative of a function describing the light quantity distribution measured by the measurement unit 80 with respect to the measurement point (second-order differentiation).

Figure 4:
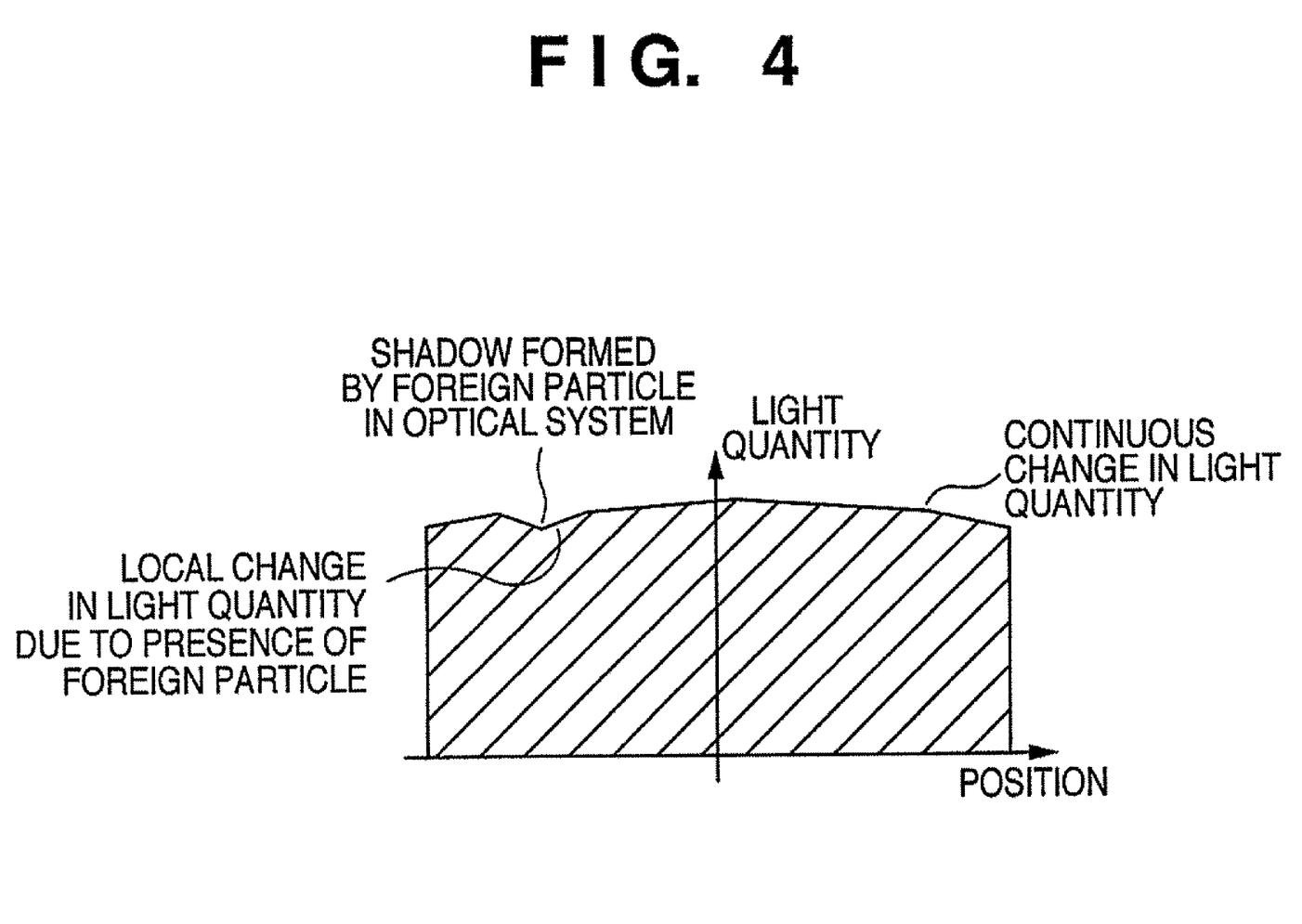
FIG. 4 is a sectional view of one example of the light quantity distribution measured by the measurement unit of the exposure apparatus shown in FIG. 1.

The principle under which a local change in light quantity can be extracted by calculating the second derivative of a function describing the light quantity distribution with respect to the measurement position will be explained with reference to FIG. 4. FIG. 4 is a sectional view of one example of the light quantity distribution measured by the measurement unit 80. Referring to FIG. 4, the abscissa indicates the measurement position and the ordinate indicates the light quantity at each measurement position. The light quantity distribution shown in FIG. 4 includes a region (a region where the light quantity decreases toward the periphery) where the light quantity continuously (moderately in a macroscopic sense) changes, and a region where the light quantity locally, steeply changes due to the presence of a foreign particle in the optical system.

For example, when the control unit 90 is to detect (evaluate) a local change in light quantity based on the difference between the maximum and minimum values of the light quantity, a continuous change in a macroscopic sense cannot be separated from a local change. Assume also that the control unit 90 detects (evaluates) a local change in light quantity by calculating the first derivative of a function describing the light quantity distribution measured by the measurement unit 80 with respect to the measurement position. The first derivative of the light quantity distribution with respect to the measurement position indicates the light quantity difference from an adjacent measurement position (measurement point). In the light quantity distribution shown in FIG. 4, the region where the light quantity continuously changes cannot be discriminated (separated) from the region where the light quantity locally changes due to the presence of the foreign particle in the optical system. If the light quantity difference from the adjacent measurement position is identical, the same value (first derivative) is obtained.

The absolute value of the second derivative of a function describing the light quantity distribution with respect to the measurement position is relatively large at a measurement position where the light quantity takes an extreme value. That the absolute value of the second derivative is relatively large means that a change in the slope of the light quantity as a function of the measurement position is relatively large. That is, the absolute value of the second derivative is relatively small in a region where the light quantity continuously (moderately in a macroscopic sense) changes, while it is relatively large in a region where the light quantity locally, steeply changes. This makes it possible to detect a local change in light quantity by evaluating the absolute value of the second derivative of the light quantity distribution as a function of the measurement position. It is also possible to detect a local change in light quantity by evaluating not the absolute value of the second derivative but the square of the second derivative. Since the square of the second derivative takes a positive number, it is easier to handle than the absolute value of the second derivative. Let $A(i,j)$ be the measurement values at measurement positions (i,j) arrayed in the grid pattern. Then, a square A"(i,j) of the second derivative of the two-dimensional light quantity distribution is given by:

$$A''(i, j) = \{A(i+1, j) - 2 \times A(i, j) + A(i-1, j)\}^2 + \{A(i, j+1) - 2 \times A(i, j) + A(i, j-1)\}^2 \quad (1)$$

The examination made by the inventors of the present invention reveals that if the square A"(i,j) of the second derivative of the light quantity distribution is equal to or smaller than 0.015 in the exposure area, a local change in light quantity falls within the allowable value in the conventional open frame inspection. In view of this, if the square A"(i,j) of the second derivative of the light quantity distribution exceeds 0.015 in the exposure area, the control unit 90 specifies the position of a foreign particle from the size of a shadow projected onto the wafer 60, as described with reference to FIGS. 12 and 13. The shadow projected onto the wafer 60 corresponds to the size of a region where the light quantity locally changes in the light quantity distribution, as shown in FIG. 4. That is, the control unit 90 specifies the position of a foreign particle in at least one of the illumination optical system 30 and the projection optical system 50 based on the light quantity distribution measured by the measurement unit 80. The specified foreign particle is removed by, e.g., cleaning or lens replacement.

If the foreign particle is dust, a local change in light quantity always takes a local minimum value and the second derivative of the light quantity distribution always takes a positive value. If dust alone is detected as the foreign particle in the optical system, a local change in light quantity may be detected (evaluated) based on the second derivative itself.

As described above, using the light quantity distribution in the exposure area, the exposure apparatus 1 can simply (e.g., quantitatively in a short period of time) detect a foreign particle (a local change in light quantity) in the optical system.

In exposure, the illumination optical system 30 illuminates the reticle 40 with a light beam emitted by the light source unit 10. The projection optical system 50 guides the light beam having passed through the reticle 40 to form an image on the wafer 60. As described above, the exposure apparatus 1 can detect and remove foreign substances in the optical systems (illumination optical system 30 and projection optical system 50). Hence, the exposure apparatus 1 can provide devices with high throughput and high quality (e.g., a semiconductor device, an LCD device, an image sensing device (e.g., a CCD), and a thin-film magnetic head).

Figure 5:
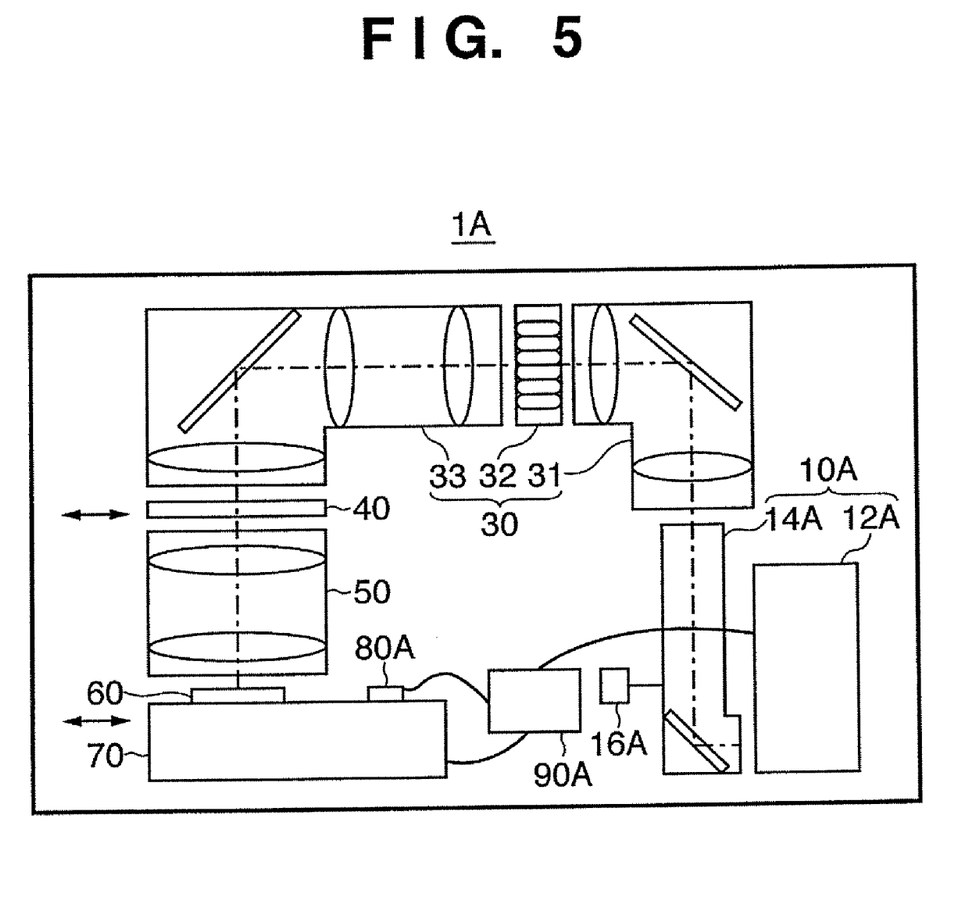
FIG. 5 is a schematic sectional view of an exposure apparatus according to one aspect of the present invention.

An exposure apparatus 1A as a modification to the exposure apparatus 1 will be explained next. FIG. 5 is a schematic sectional view of the exposure apparatus 1A according to the present invention. The exposure apparatus 1A is a projection exposure apparatus which transfers the pattern of the reticle 40 onto the wafer 60 by exposure in a step-and-scan manner while relatively scanning (driving) them. The exposure apparatus 1A is different from the exposure apparatus 1 in that a light source unit 10A, measurement unit 80A, and control unit 90A are used.

The light source unit 10A includes a light source 12A, light-leading optical system 14A, and swing unit 16A. In this modification, the light source 12A uses an excimer laser such as an ArF excimer laser (wavelength: about 193 nm) or a KrF excimer laser (wavelength: about 248 nm). However, the light source 12A is not limited to an excimer laser and may use another laser or superhigh pressure mercury lamp. The light-leading optical system 14A guides laser light emitted by the light source 12A to the illumination optical system 30. The swing unit 16A linearly or pivotally swings the light-leading optical system 14A to reduce speckles attributed to the laser light coherence.

In the exposure apparatus 1A, since the light quantity on the wafer 60 takes a value obtained by integrating the light quantity distribution in the scanning direction (driving direction), the light quantity distribution in the exposure area in the scanning direction becomes uniform. A local change in light quantity in the exposure area therefore occurs only in a direction perpendicular to the scanning direction of the reticle 40 and wafer 60. In view of this, the measurement unit 80A uses a slit sensor in this modification.

Figure 6:
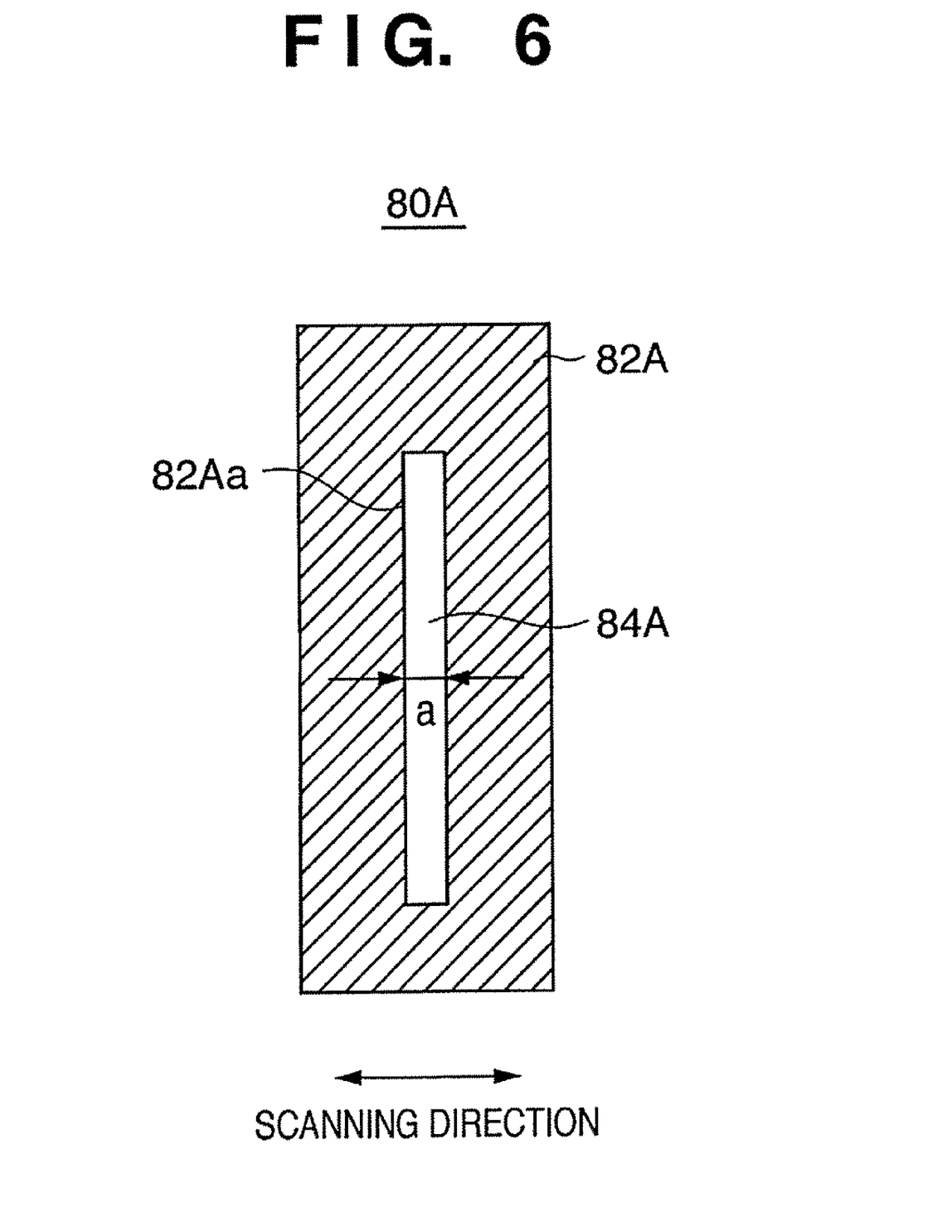
FIG. 6 is a schematic plan view of a slit sensor as one example of a measurement unit of the exposure apparatus shown in FIG. 5.

As shown in FIG. 6, the slit sensor as the measurement unit 80A includes a mask 82A having a slit 82Aa and a light receiving unit 84A. The slit 82Aa has a dimension a (mm) in the widthwise direction and its longitudinal direction corresponds to the scanning direction of the reticle 40 and wafer 60. The light receiving unit 84A receives the light beam having passed through the slit 82Aa. The slit sensor as the measurement unit 80A can measure the light quantity in an area of (the dimension a in the widthwise direction)×(the (dimension in the longitudinal direction). The dimension a (mm) of the slit 82Aa in the widthwise direction is preferably equal to or shorter than 1/50 the exposure area. For example, in an exposure apparatus having an exposure area of 26 (mm)× 33 (mm), the dimension a (mm) in the widthwise direction is preferably equal to or shorter than 0.5 (mm). Here, FIG. 6 is a schematic plan view of the slit sensor as one example of the measurement unit 80A.

Figure 7:
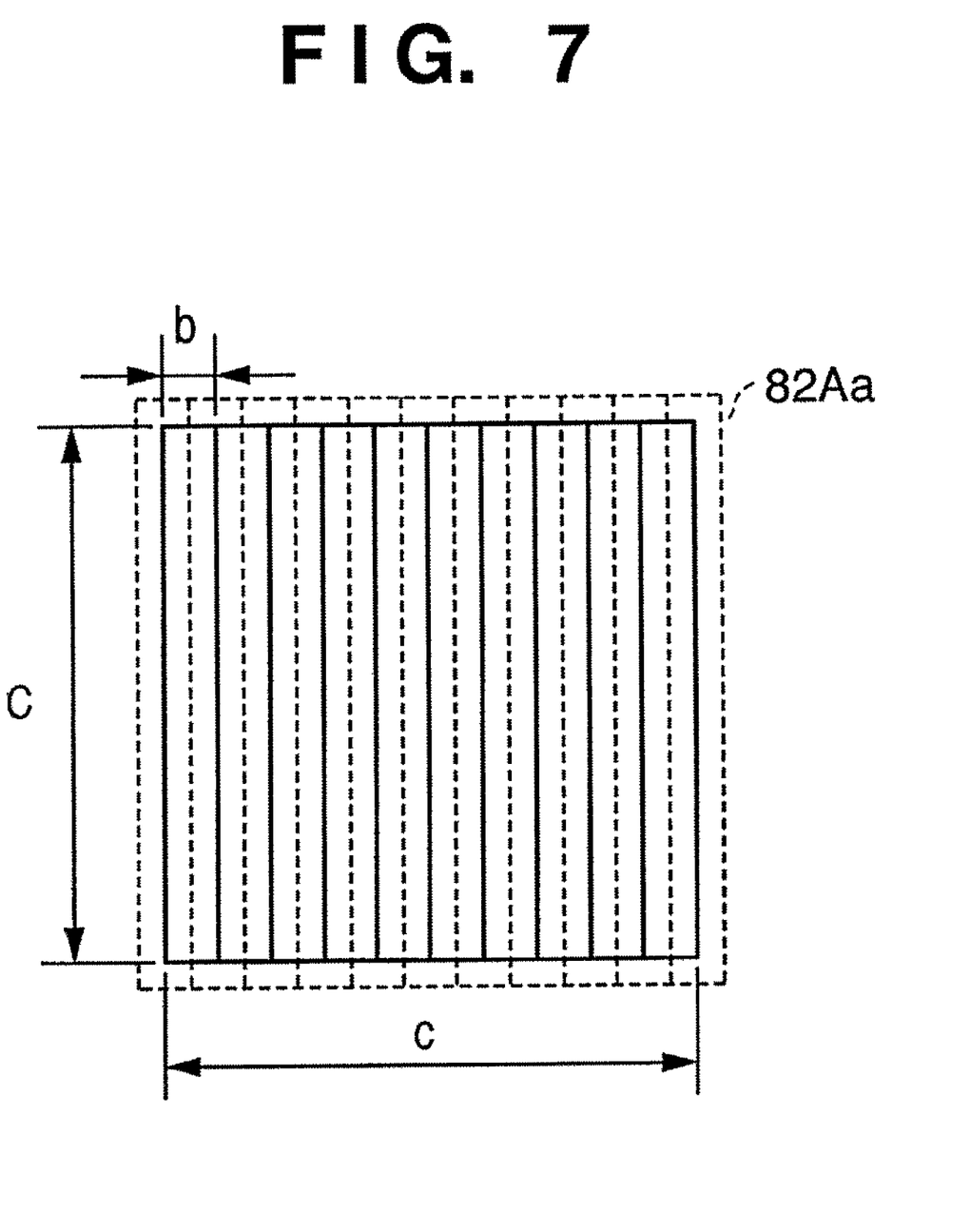
FIG. 7 is a view for explaining the measurement of the light quantity (light quantity distribution) in an exposure area by the slit sensor as the measurement unit of the exposure apparatus shown in FIG. 6.

FIG. 7 is a view for explaining the measurement of the light quantity (light quantity distribution) in the exposure area by the slit sensor as the measurement unit 80A. Referring to FIG. 7, the dotted lines indicate the positions (measurement positions) of the slits 82Aa, i.e., the slit sensor in light quantity measurement. The slit sensor as the measurement unit 80A detects the light quantity at each measurement position (measurement point) while moving within an exposure area (or a part of the exposure area) of c (mm)×c (mm) step by step at a pitch b (mm). With this operation, the slit sensor as the measurement unit 80A can finely measure the light quantity distribution in the exposure area in a direction perpendicular to the scanning direction. The pitch b (mm) is preferably equal to or narrower than 1/50 the exposure area. For example, in an exposure apparatus having an exposure area of 26 (mm)×33 (mm), the pitch b (mm) is preferably equal to or narrower than 0.5 (mm). It is also preferable to make it possible to detect only the light quantity (light quantity distribution) in a part of the exposure area for the following reason. That is, the detection of the light quantity (light quantity distribution) over the entire exposure area requires a large number of measurement points and hence takes a too long measurement time. An arbitrary area can be desirably designated as the part of the exposure area.

The measurement unit 80A is not limited to a slit sensor and may use a sensor array in which sensors are arrayed in the scanning direction of the reticle 40 and wafer 60. When the measurement unit 80A uses a sensor array, it can measure the light quantity distribution in the exposure area by adding the output values from the respective sensors.

The control unit 90A includes a CPU and memory and controls the operation of the exposure apparatus 1A. For example, the control unit 90A controls the light quantity (exposure light quantity) in the exposure area by adjusting oscillation of laser light from the light source 12A. In addition, according to this modification, the control unit 90A analyzes the output (measurement result) from the measurement unit 80A to detect and evaluate a local (discontinuous) change in light quantity in the exposure area. In other words, the control unit 90A functions as an abnormality detection unit which detects, based on the light quantity distribution measured by the measurement unit 80A, a foreign particle that exists in the optical system (at least one of the illumination optical system 30 and the projection optical system 50) and causes a local change in light quantity.

More specifically, the control unit 90A calculates the second derivative of a function describing a one-dimensional (in a direction perpendicular to the scanning direction) light quantity distribution measured by the measurement unit 80A with respect to the measurement position. In other words, the control unit 90A detects (evaluates) a local change in light quantity based on the second derivative of the light quantity distribution measured by the measurement unit 80A with respect to the measurement position. In this modification, the control unit 90A uses the square of the second derivative of the one-dimensional light quantity distribution. Let B(i) be the measurement value at a measurement position (i). Then, a square B"(i) of the second derivative of the one-dimensional light quantity distribution is given by:

$$B''(i) = \{B(i+1) - 2 \times B(i) + B(i-1)\}^2 \quad (2)$$

The examination made by the inventors of the present invention reveals that if the square B"(i) of the second derivative of the one-dimensional light quantity distribution is equal to or smaller than 0.01 in the exposure area, a local change in light quantity falls within the allowable value in the conventional open frame inspection. In view of this, if the square B"(i) of the second derivative exceeds 0.01 in the exposure area, the control unit 90A specifies the position of a foreign particle from the size of a shadow projected onto the wafer 60, as described with reference to FIGS. 12 and 13. The shadow projected onto the wafer 60 corresponds to the size of a region where the light quantity locally changes in the light quantity distribution. That is, the control unit 90A specifies the position of a foreign particle in at least one of the illumination optical system 30 and the projection optical system 50 based on the light quantity distribution acquired by the measurement unit 80A. The specified foreign particle is removed by, e.g., cleaning or lens replacement.

As described above, using the light quantity distribution in the exposure area, the exposure apparatus 1A can simply (e.g., quantitatively in a short period of time) detect a foreign particle (a local change in light quantity) in the optical system.

Figure 8:
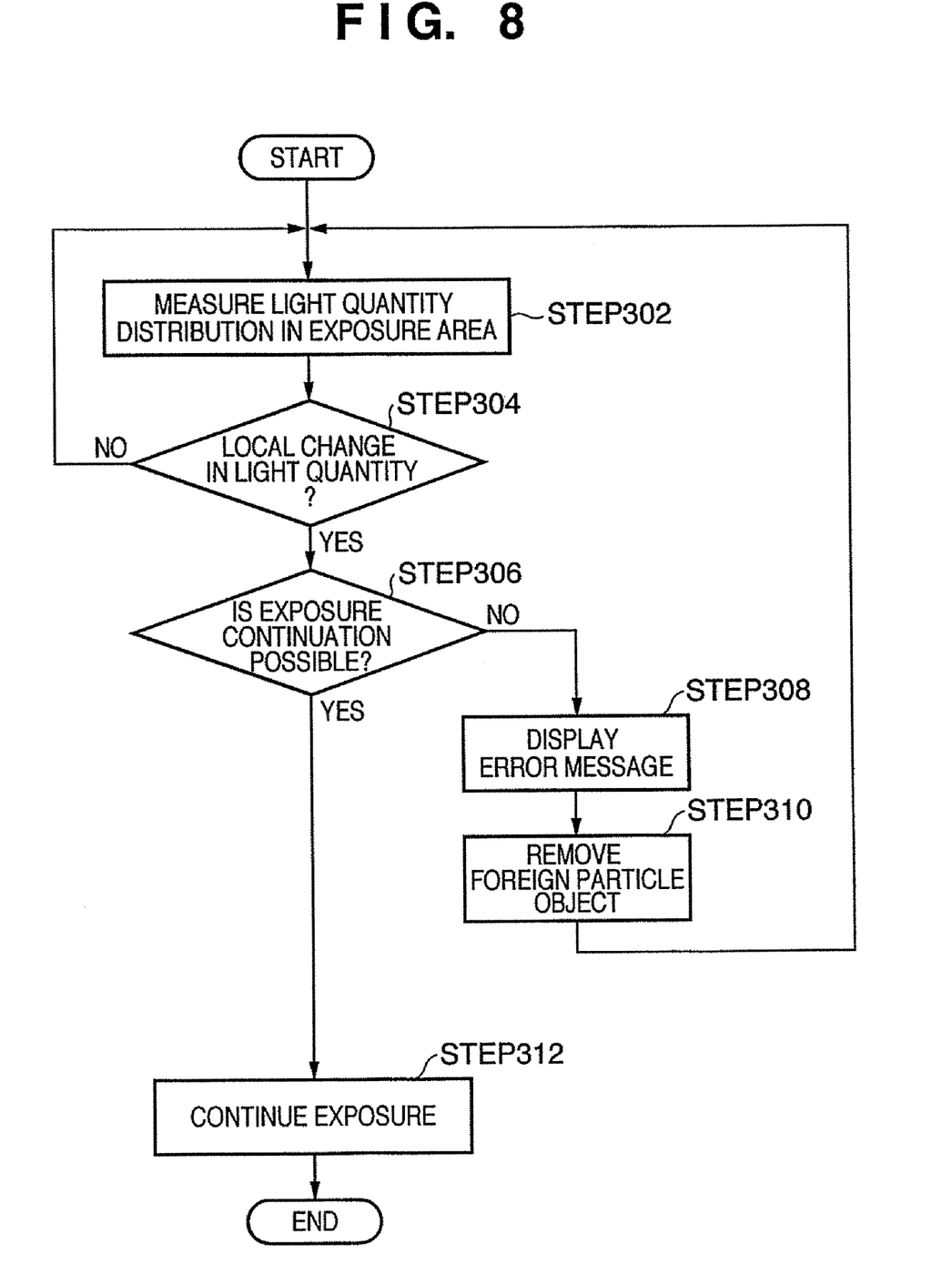
FIG. 8 is a flowchart for explaining an exposure method according to one aspect of the present invention.

An exposure method using the exposure apparatus 1 or 1A will be explained next with reference to FIG. 8. FIG. 8 is a flowchart for explaining an exposure method according to one aspect of the present invention. This exposure method monitors a local change in light quantity in an exposure area during exposure, and stops exposure if a local change that falls outside the allowable value is detected. This makes it possible to prevent the fabrication of any defective semiconductor device (image sensing device or display device), thus improving the yield. Since the exposure method using the exposure apparatus 1 and one using the exposure apparatus 1A are substantially the same, the exposure method using the exposure apparatus 1 will be exemplified below.

Referring to FIG. 8, as exposure starts, the measurement unit 80 detects the light quantity at a measurement position in an exposure area and measures the light quantity distribution in the exposure area (step 302). The light quantity distribution measured by the measurement unit 80 is transmitted to the control unit 90. The control unit 90 calculates the second derivative of a function describing the light quantity distribution from the measurement unit 80 with respect to the measurement position, and determines whether a local change in light quantity has occurred in the exposure area (step 304). In other words, based on the light quantity distribution from the measurement unit 80, the control unit 90 determines whether a foreign particle exists in the illumination optical system 30 and the projection optical system 50 (abnormality determination step).

If the control unit 90 determines in step 304 (abnormality determination step) that no local change in light quantity has occurred in the exposure area, the process returns to step 302 to measure the light quantity in the exposure area while continuing exposure. If the control unit 90 determines in step 304 that a local change in light quantity has occurred in the exposure area, it determines whether to continue exposure (i.e., whether the local change in light quantity in the exposure area falls within the allowable value) (step 306). Assume, for example, that the control unit 90 evaluates a local change in light quantity on the basis of the square of the second derivative of the light quantity distribution. In this case, the control unit 90 determines that exposure continuation is possible if this value is equal to or smaller than 0.015, while it determines that exposure continuation is impossible if this value is larger than 0.015. If the control unit 90 determines that exposure continuation is impossible, it preferably specifies the position of a foreign substance in at least one of the illumination optical system 30 and the projection optical system 50 based on the light quantity distribution measured by the measurement unit 80.

If the control unit 90 determines in step 306 (exposure determination step) that exposure continuation is possible, exposure is continued (step 312). If the control unit 90 determines in step 306 that exposure continuation is impossible, exposure is stopped and an error message (i.e., a message representing that a foreign particle exists in the optical system) is displayed (step 308). The position of the foreign particle is preferably displayed by the size of a region where the light quantity changes. The foreign particle in the illumination optical system 30 and the projection optical system 50 is removed in accordance with the error message (step 310). Then, the process returns to step 302.

As described above, according to the exposure method of this embodiment, whether a local change in light quantity has occurred during exposure is determined. This makes it possible to prevent the fabrication of any defective semiconductor device by exposing the wafer 60 while a local change in exposure light quantity is relatively large. It is therefore possible to improve the yield and productivity of semiconductor devices.

Figure 9:
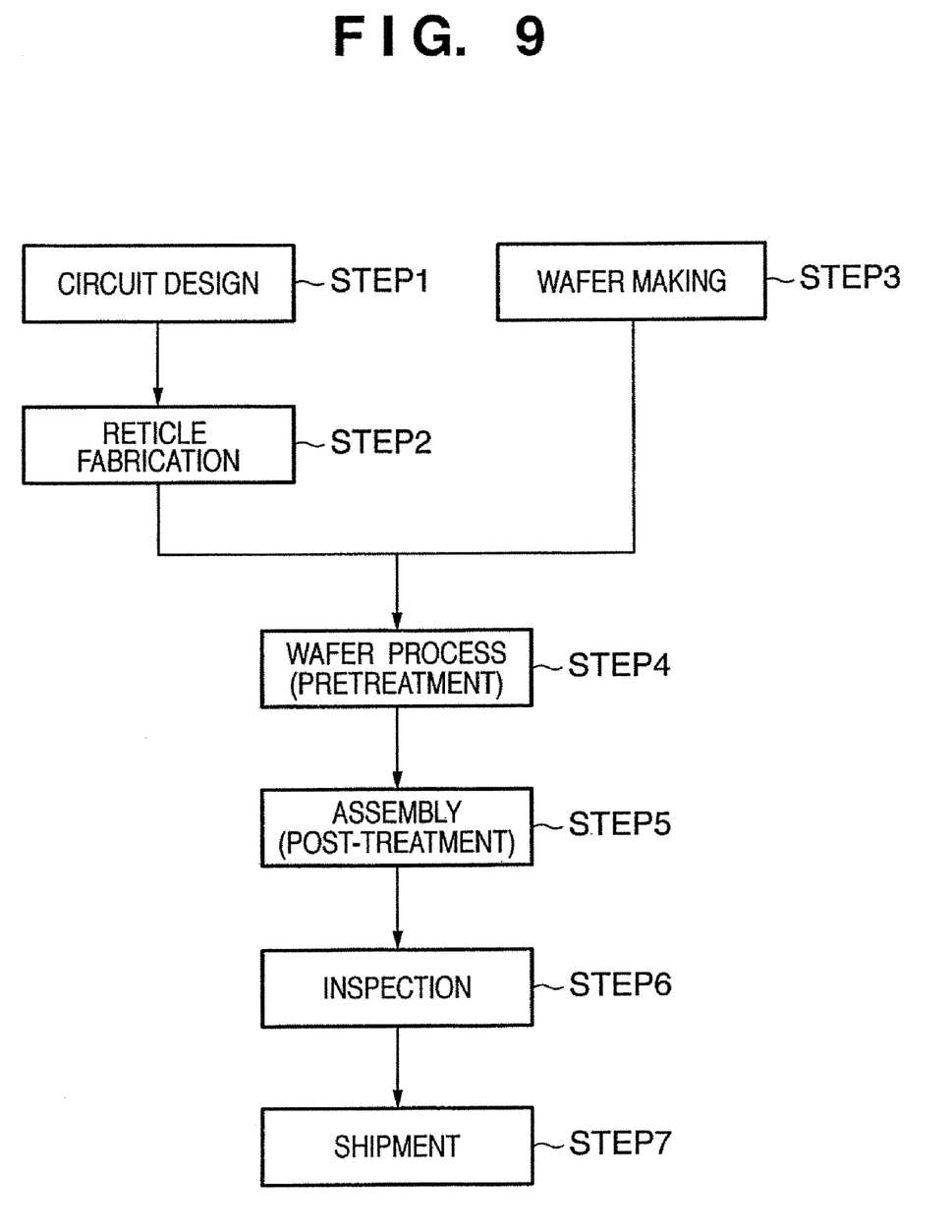
FIG. 9 is a flowchart for explaining a method for fabricating device.
Figure 10:
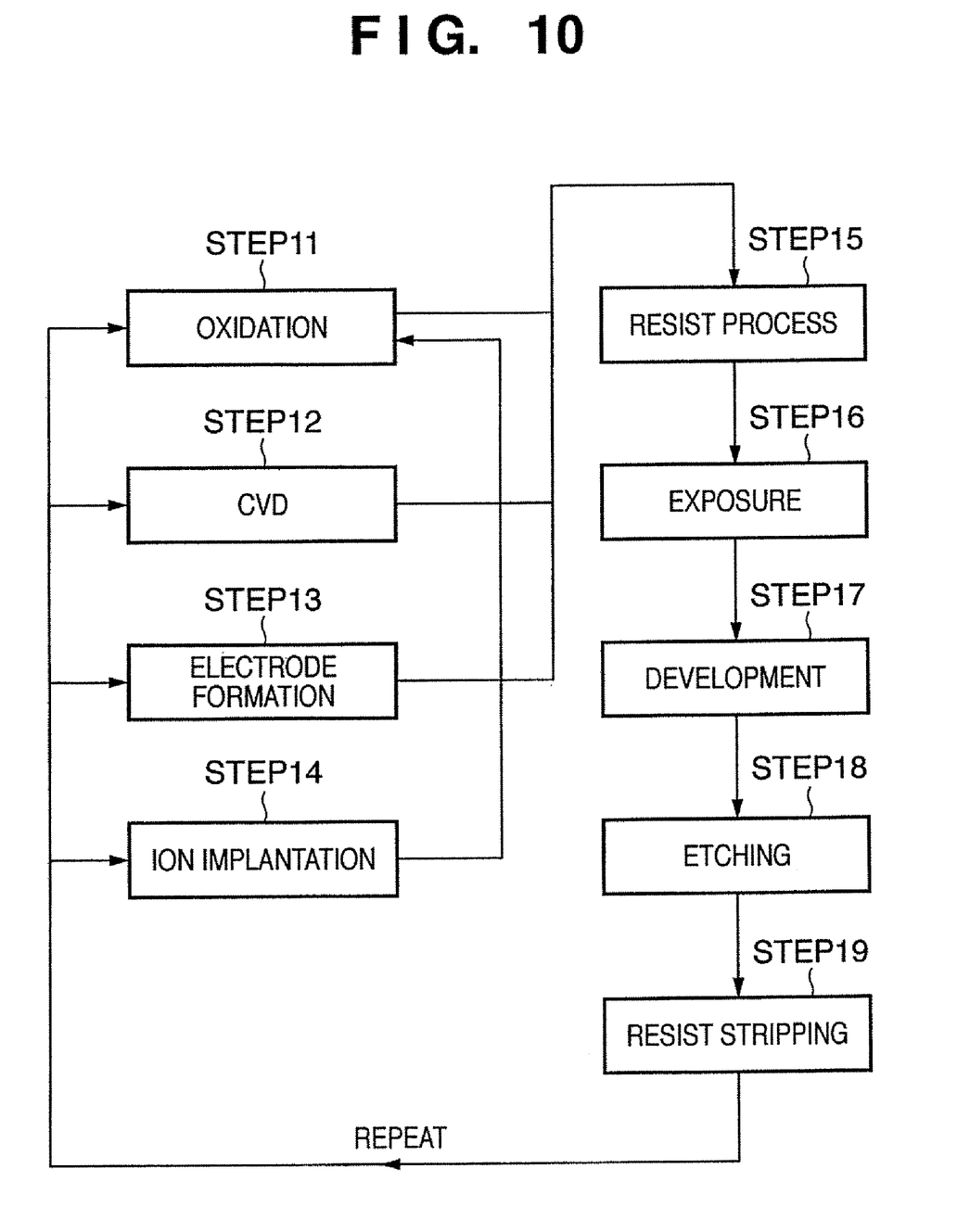
FIG. 10 is a detail flowchart of a wafer process in Step 4 of FIG. 9.

Referring now to FIGS. 9 and 10, a description will be given of an embodiment of a device fabrication method using the above mentioned exposure apparatus 1 or 1A. FIG. 9 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer making) manufactures a wafer using materials such as silicon. Step 4 (wafer process), which is also referred to as a pretreatment, forms the actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 or 1A to expose a circuit pattern from the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 1 or 1A, and resultant devices constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese application No. 2006-322526 filed on Nov. 29, 2006, which is hereby incorporated by reference herein in its entirety.

What is claimed is:

1. An exposure apparatus comprising:
an illumination optical system configured to illuminate a reticle with a light beam from a light source;
a projection optical system configured to project a pattern of the reticle onto a substrate;
a measurement unit configured to measure a light quantity distribution in an exposure area on an image plane of the projection optical system; and
a detection unit configured to calculate, with respect to a position, a second derivative of a function describing the light quantity distribution measured by the measurement unit, and to detect an existence of a foreign particle in the illumination optical system, the projection optical system, or both the illumination optical system and the projection optical system based on the calculated second derivative.

2. An exposure apparatus comprising:
an illumination optical system configured to illuminate a reticle with a light beam from a light source;
a projection optical system configured to project a pattern of the reticle onto a substrate;
a measurement unit configured to measure a light quantity distribution in an exposure area on an image plane of the projection optical system, the measurement unit including a pinhole sensor including a pinhole and a light receiving unit configured to receive the light beam having passed through the pinhole, the measurement unit configured to measure the light quantity distribution in the exposure area by detecting a light quantity via the pinhole sensor positioned at each of measurement points arrayed in a two-dimensional grid pattern; and
a detection unit configured to detect an existence of a foreign particle in the illumination optical system, the projection optical system, or both the illumination optical system and the projection optical system based on a second derivative, with respect to a position, of the light quantity distribution measured by the pinhole sensor.

3. An exposure apparatus comprising:
an illumination optical system configured to illuminate a reticle with a light beam from a light source;
a projection optical system configured to project a pattern of the reticle onto a substrate;
a measurement unit configured to measure a light quantity distribution in an exposure area on an image plane of the projection optical system; and
a detection unit configured to detect an existence of a foreign particle in the illumination optical system, the projection optical system, or both the illumination optical system and the projection optical system based on the light quantity distribution measured by the measurement unit,
wherein the reticle and substrate are relatively scanned,
wherein the measurement unit includes a slit sensor including a slit and a light receiving unit, the slit having a longitudinal direction corresponding to a scanning direction of the reticle and the substrate, the light receiving unit being configured to receive the light beam having passed through the slit, and the measurement unit being configured to measure the light quantity distribution in the exposure area by detecting a light quantity via the slit sensor positioned at each of measurement points arrayed in a direction perpendicular to the scanning direction of the reticle and the substrate, and
wherein the detection unit is configured to detect the existence of the foreign particle in the illumination optical system, the projection optical system, or both the illumination optical system and the projection optical system based on a second derivative, with respect to a position, of the light quantity distribution measured by the slit sensor.

4. A method of fabricating a device, the method comprising:
exposing a substrate to a pattern using an exposure apparatus defined in claim 1;
developing the exposed substrate; and
processing the developed substrate to fabricate the device.

5. A method of fabricating a device, the method comprising:
exposing a substrate to a pattern using an exposure apparatus defined in claim 2;
developing the exposed substrate; and
processing the developed substrate to fabricate the device.

6. A method of fabricating a device, the method comprising:
exposing a substrate to a pattern using an exposure apparatus defined in claim 3;
developing the exposed substrate; and
processing the developed substrate to fabricate the device.

* * * * *